United States Patent
Huckabee

(10) Patent No.: US 7,701,073 B2
(45) Date of Patent: Apr. 20, 2010

(54) LOCKING FEATURE AND METHOD FOR MANUFACTURING TRANSFER MOLDED IC PACKAGES

(75) Inventor: James R. Huckabee, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 322 days.

(21) Appl. No.: 11/856,903

(22) Filed: Sep. 18, 2007

(65) Prior Publication Data

US 2008/0067648 A1  Mar. 20, 2008

Related U.S. Application Data

(60) Provisional application No. 60/826,138, filed on Sep. 19, 2006.

(51) Int. Cl.
*H01L 23/02* (2006.01)
(52) U.S. Cl. .................. 257/787; 257/788; 361/760; 361/765
(58) Field of Classification Search .......... 257/787, 257/788, 678; 361/760–765; 438/118, 124
See application file for complete search history.

(56) References Cited

U.S. PATENT DOCUMENTS

| | | | |
|---|---|---|---|
| 3,650,648 A * | 3/1972 | Lambrecht | 425/129.1 |
| 6,262,490 B1 * | 7/2001 | Hsu et al. | 257/787 |
| 6,482,675 B2 | 11/2002 | Hsu et al. | |
| 7,084,003 B2 | 8/2006 | Mazzola et al. | |
| 2005/0275071 A1 | 12/2005 | Masuda et al. | |
| 2005/0287715 A1 * | 12/2005 | Lum et al. | 438/127 |

* cited by examiner

*Primary Examiner*—Leonardo Andújar
(74) *Attorney, Agent, or Firm*—Yingsheng Tung; Wade J. Brady, III; Frederick J. Telecky, Jr.

(57) ABSTRACT

The invention discloses integrated circuits (ICs), molded IC packages, and to leadframe arrays, package arrays and methods for their manufacture. Leadframe arrays and package arrays used for the manufacture of IC packages by transfer molding processes include a locking feature adapted for encapsulation. The locking feature is situated in a strap of the leadframe array overlying a gate between mold cavities. The strap lock formed by curing encapsulant in the locking feature of the strap strengthens the resulting package array and provides improved mold extraction and handling characteristics.

14 Claims, 6 Drawing Sheets

LOCKING FEATURE AND METHOD FOR MANUFACTURING TRANSFER MOLDED IC PACKAGES

PRIORITY ENTITLEMENT

This application is entitled to priority based on Provisional Patent Application Ser. No. 60/826,138 filed on Sep. 19, 2006, which is incorporated herein for all purposes by this reference. This application and the Provisional Patent Application have at least one common inventor and are assigned to the same entity.

TECHNICAL FIELD

The invention relates to electronic semiconductor devices and manufacturing. More particularly, the invention relates to microelectronic integrated circuits (ICs), molded IC packages, and to leadframe arrays, package arrays, and methods for their manufacture and for the manufacture of transfer molded IC packages.

BACKGROUND OF THE INVENTION

Generally speaking, semiconductor devices such as integrated circuits (ICs) are manufactured by forming layered metallic circuit components and patterns on a semiconductor wafer. Numerous such ICs are formed on a single wafer. The individual ICs are separated from one another by a singulation process, such as sawing. Each IC is typically mounted on a metallic leadframe, and the IC-leadframe assembly is then encapsulated within a package. Package material, or "encapsulant" is commonly made from viscous or semi-viscous plastic or epoxy resin, which is cured to form a hardened protective cover to shield the protect the IC assembly from environmental hazards such as dust, heat, moisture, mechanical shock, and external electricity.

Integrated circuit packaging is usually accomplished using a molding process. The specifics of the process are influenced by many factors such as the IC and leadframe geometry, and encapsulant material used, but generally proceeds along the lines of one of the most widely used manufacturing processes, known as transfer molding. Molten encapsulant, sometimes also called mold compound, is compressed and is then distributed through a mold containing numerous IC-leadframe assemblies via a network of runners and gates. The IC assemblies include a number of ICs attached to suitable locations on an array of leadframes. Typically, multiple leadframes are manufactured in an array interconnected by sacrificial metal segments extending between the individual leadframes for manufacturing purposes.

Commonly, a mold for use in IC packaging is made up of a top half and a bottom half. The opposing halves enclose multiple cavities designed to receive an array of connected IC-leadframe assemblies, and to enclose them during molding and curing. Conventional molds include gates and runners which conduct the molten encapsulant to the series of mold cavities formed between the mated mold set halves. Gates are small openings into these cavities through which the encapsulant is introduced. Frequently, in what is commonly referred to as a side-gate system, encapsulant is injected into the mold cavities through gates formed in the molds that are lateral to the surface of the leadframe array. In conventional side-gate systems, the mold cavities are ordinarily filled in series, i.e., cavities that are nearer the encapsulant source get filled first, and the encapsulant flows through connecting gates to fill subsequent mold cavities.

When the encapsulant is sufficiently cured, the array of molded IC packages is removed from the mold, forcibly extracting the cured encapsulant from the mold. The individual packages are ultimately singulated from the array in which they were formed by cutting along the sacrificial segments pre-defined on the leadframe array. During the process of extracting the package array from the mold, package failures such as breaks, cracks, or chip-out may occur. In some instances, the gates of the mold may become blocked by cured encapsulant remaining in the gates after the IC package array is removed. This occurrence is more likely in instances where the sacrificial portion of the leadframe array spanning the mold gate, herein denominated the "strap" is insufficiently adhered to the cured encapsulant in the gate. In such cases where the bond between the encapsulant and the gate is stronger than that between the encapsulant and the strap, problems result. Upon extraction of the cured, molded package array from the mold, the connecting straps are pulled away from the encapsulant adhering to the mold gate. The resulting blockage of cured encapsulant remaining in the gate causes incomplete filling of the mold in subsequent attempts to inject encapsulant into the mold. This decreases productivity and necessitates increased downtime for mold cleaning or replacement.

Due to these and other technological challenges, improved IC package molding methods, improved package arrays, and improved leadframe arrays would be useful and advantageous in the arts. The present invention is directed to overcoming, or at least reducing the effects of one or more of the problems noted above.

SUMMARY OF THE INVENTION

In carrying out the principles of the present invention, in accordance with preferred embodiments, the invention provides advances in the art with novel methods and apparatus directed to providing strap lock features and techniques for improving package array mechanical integrity and reducing mold gate blockage.

According to one aspect of the invention, an IC leadframe array includes numerous package regions adapted for receiving ICs and for ultimately residing within IC packages. A supporting structure of the leadframe array is adapted for supporting the package regions during handling and transfer molding. The supporting structure includes straps connecting the package regions. The straps span the mold gates, each have at least one locking feature adapted for the formation of a strap lock upon encapsulation.

According to another aspect of the invention, an IC package array includes a leadframe array. The leadframe array has package regions for receiving ICs and a supporting structure for supporting the package regions. Straps of the supporting structure, located between package regions, overlay mold gate areas. A number of ICs are mounted on the package regions of the leadframe array and are encapsulated. Strap locks are formed from encapsulant entering portions of the straps configured for encapsulation.

According to another aspect of the invention, a method for transfer molding IC packages includes steps for providing a mold adapted to receive an IC assembly. The mold has cavities for receiving leadframe-mounted ICs, with one or more gates adapted for channeling the flow of encapsulant between the cavities. An array of leadframe-IC assemblies is placed into the mold such that each of a number of ICs affixed to chip sites of the leadframe occupies a cavity. The leadframes within the individual cavities include straps spanning the gates of the mold. Encapsulant is flowed into the mold, whereby the ICs and leadframes are encapsulated, and whereby at least a portion of each strap is enclosed in encapsulant, forming a strap lock. Ultimately, the resulting array of IC packages is removed from the mold.

According to another aspect of the invention, an IC leadframe array incorporates a locking feature including a groove in the strap.

According to yet another aspect of the invention, an IC leadframe array incorporates a locking feature including a V-groove in the strap.

According to still other aspects of the invention, an IC leadframe array includes a locking feature with a transverse or longitudinal groove in a strap.

According to another aspect of the invention, an IC leadframe array locking feature includes a rabbeted strap edge.

According to yet another aspect of the invention, an IC leadframe array locking feature has a beveled strap edge.

According to still other aspects of the invention, an IC leadframe array includes a locking feature with a downset strap or strap portion.

The invention has advantages including but not limited to one or more of the following: improved leadframe arrays for IC packaging processes; strengthened IC package arrays; improved methods for transfer molding IC packages. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DESCRIPTION OF PREFERRED EMBODIMENTS

The invention provides locking features for leadframe arrays and IC package arrays and related methods for manufacturing molded IC packages. In general, straps included in the supporting structure between leadframes of a leadframe array incorporate features adapted for forming strap locks upon encapsulation by transfer molding.

Figure 1:
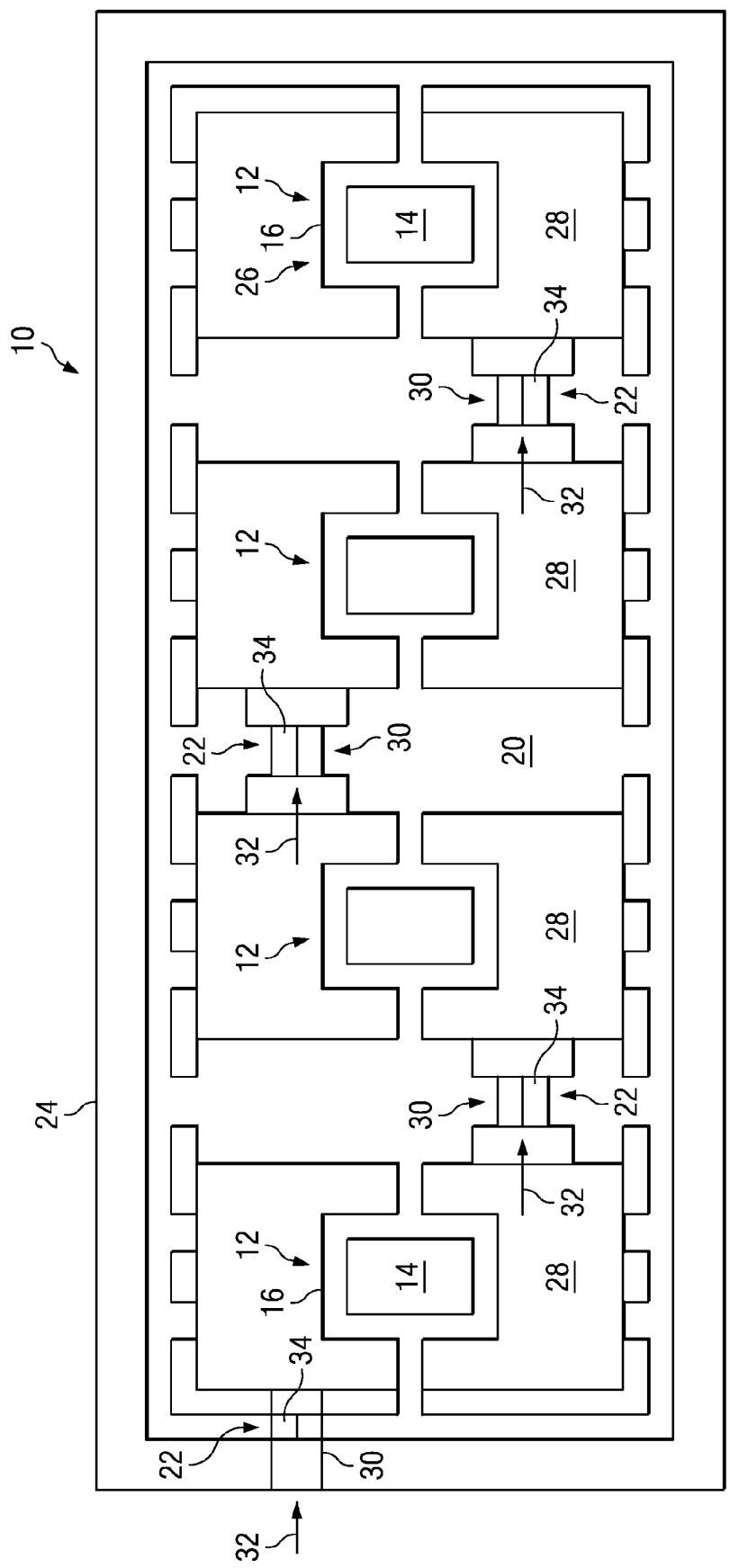
FIG. 1 is a top view of an example of preferred embodiments of a leadframe array, package array, locking feature, and methods for making molded IC packages according to the invention.

Referring to FIG. 1, an IC package leadframe array 10 is shown. A number of individual leadframes 12 of the array 10 are adapted for receiving ICs 14 and for forming operable packaged ICs upon molding and singulation. Typically, paddles 16 and often leads (not shown) are supported during handling and manufacturing by a sacrificial supporting structure 20 not part of the leadframes 12 of a finished package. The supporting structure 20 of the leadframe array 10 may take various forms within the scope of the invention. Straps 22 are included as portions of the supporting structure 20 situated between individual leadframes 12 of the array 10, as more particularly described. A mold 24, commonly provided in two halves, only one of which is illustrated, is configured for receiving the leadframe array 10 assembled with attached ICs 14, such combination hereinafter referred to as the leadframe-IC assembly 26. The mold 24 includes cavities 28, each designed to receive an individual leadframe-IC assembly 26, and preferably a portion of its supporting structure 20. Between mold cavities 28, gates 30 are provided to facilitate the flow of encapsulant 32 into and between and among the mold cavities 28. Note that in FIG. 1, the encapsulant 32 is represented with arrows indicating a preferred flow pattern, so as not to obscure the aspects of the apparatus and methods of the invention that would typically be covered by the encapsulant. It should be understood that the straps 22 of the leadframe array 10 are arranged to correspond with at least some of the gates 30, preferably all gates 30 between mold cavities 28, sometimes called secondary gates. In transfer molding, the leadframe-IC assembly 26 is placed in the mold 24 and the mold 24 is filled with molten encapsulant 32, encompassing the leadframe-IC assembly 26, which may also include bondwires attached to leadfingers. Subsequent to encapsulation, the leadframe-IC assembly 26 is removed from the mold 24. Ultimately, the individual encapsulated leadframe-IC assemblies 26 are singulated from the array 10, preferably by sawing through the encapsulant and leadframe array 10 along selected portions of the array 10 coinciding with the supporting structure 20. According to the various embodiments of the invention, the straps 22 include locking features 34 suitable for enhancing the bond formed between the strap 22 and the encapsulant 32. The locking features 34 may be implemented by various means in various alternative embodiments, preferably by the formation of cut-out or indented portions of the strap as further described in the examples below.

Figure 2:
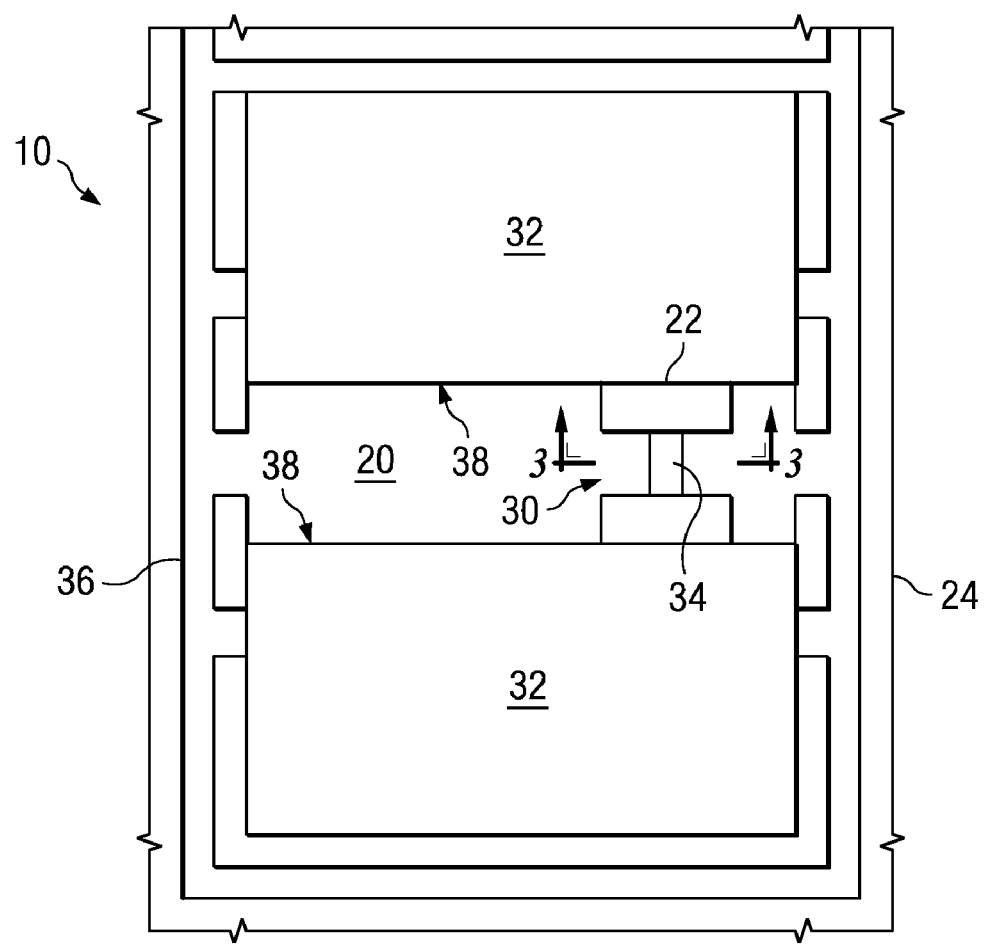
FIG. 2 is a simplified top macro view of a portion of a leadframe array and package array according to a preferred embodiment of the invention as shown in and described with reference to FIG. 1.
Figure 3:
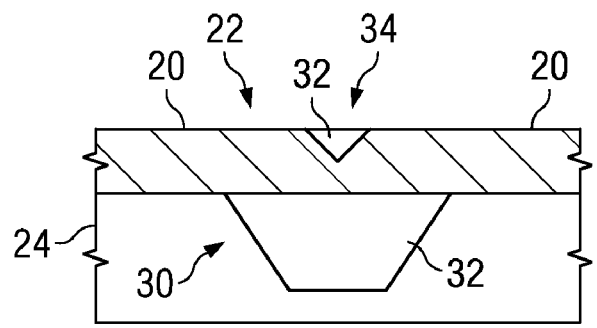
FIG. 3 is a cutaway partial side view of the exemplary preferred embodiment of the invention of FIG. 2 taken along line 3.

An example of a preferred embodiment of the invention is shown in FIG. 2 in a top detail view of a portion of a leadframe array 10 similar to that introduced in FIG. 1. After the encapsulant 32 has cured, a package array 36 includes the leadframe-IC assemblies 26 which may be removed from the mold 24. The leadframe-IC assemblies 26 are surrounded by encapsulant 32 suitable for providing individual packages 38 upon singulation. The supporting structure 20 of the leadframe array 10 is partially encapsulated as well during the molding process. The gate areas 30 are spanned by straps 22 of the supporting structure 20. The straps 22 include locking features 34. The locking features 34 are configured for receiving encapsulant 32 during molding. Now also referring to the cutaway partial side view of FIG. 3, taken along line 3 of FIG. 2, it may be seen in this example that the locking feature 34, in this case a V-groove, ensures that encapsulant 32 engulfs a portion of the strap 22. In this way, the locking feature 34 strengthens the bond between encapsulant 32 and the strap 22 directly above the gate 30. It should be understood by those skilled in the arts that the locking feature 34 thus improves the integrity of the package array 36 such that extraction from the mold 24 is less likely to cause encapsulant 32 to separate from the package array 36 and remain in the gate 30. The strength enhancement provided by the locking features 34 may also make the package array 36 less susceptible to damage during handling subsequent to extraction and prior to singulation. The locking features 36 of the invention may be implemented in various configurations without departure from the principles of the invention. For example, in a departure from the V-groove locking feature 34 shown in FIG. 3, a U-shaped groove may be used. Also, the locking feature 34 shown oriented transverse to the direction of the strap 22 may alternatively be oriented in a longitudinal or oblique orientation within the scope of the invention.

Figure 4:
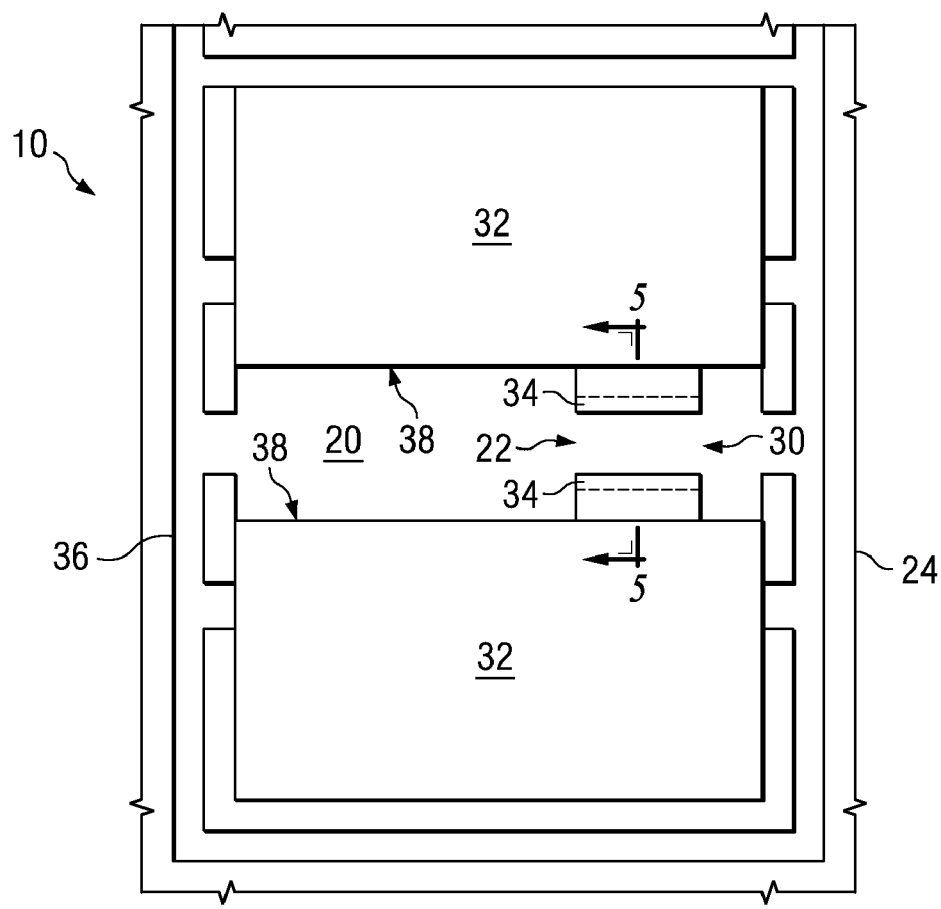
FIG. 4 is a simplified top view of a portion of a package array showing an alternative preferred embodiment of the invention.
Figure 5:
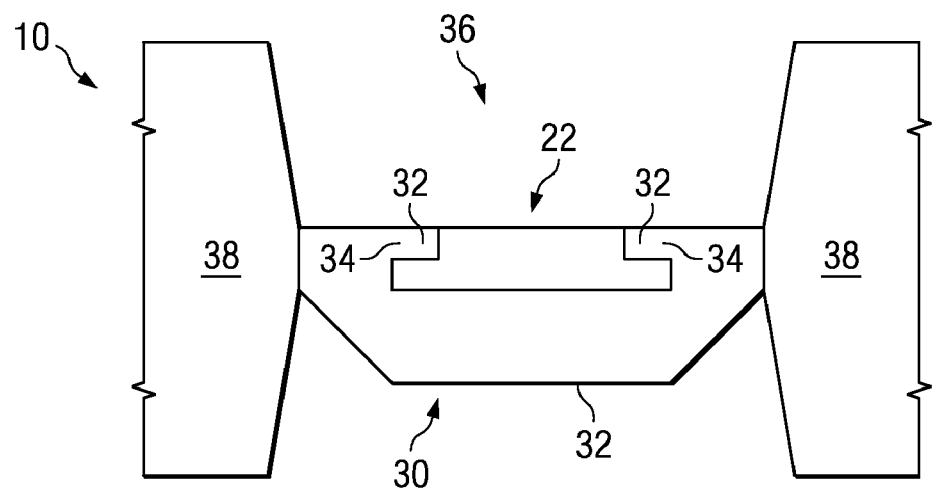
FIG. 5 is a cutaway partial side view of the exemplary preferred embodiment of the invention of FIG. 4 taken along line 5.
Figure 6:
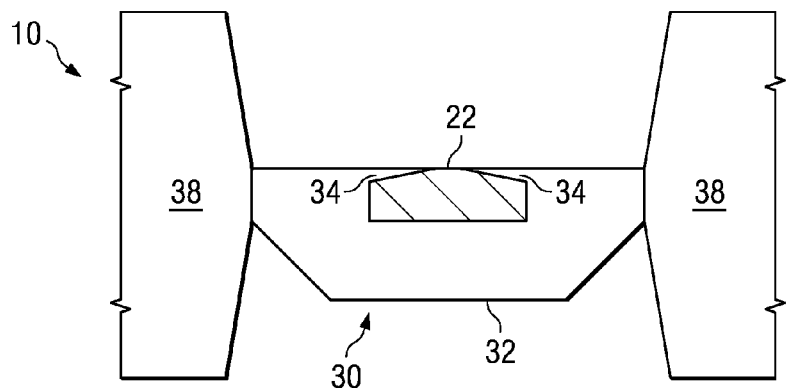
FIG. 6 is a cutaway partial side view of another example of a preferred embodiment of a package array according to the invention.

Alternative embodiments of the invention may vary in their particulars and need not all be shown and described herein. Another example of a preferred embodiment of the invention is depicted in FIGS. 4 and 5. FIG. 4 shows a top detail view of a portion of a package array 36. A portion of the supporting structure 20 of the leadframe array 10 is encapsulated, specifically, the straps 22 of the supporting structure 20 spanning the gate areas 30. The locking features 34 incorporated into the straps 22 are filled with encapsulant 32. In this example, as can be seen in the cross-section of FIG. 5, the locking features 34 constitute rabbeted edges of the metal strap 22. The rabbets 34 are configured for receiving encapsulant 32 during molding and strengthening the bond between encapsulant 32 and the strap 22 directly above the gate 30. In an illustration of another alternative embodiment, a similar view is shown in FIG. 6, depicted locking features 34 in the configuration of bevels 34 at the edges of the strap 22 adapted to be engulfed with encapsulant 32 in order to implement the principles and advantages of the invention.

Figure 7:
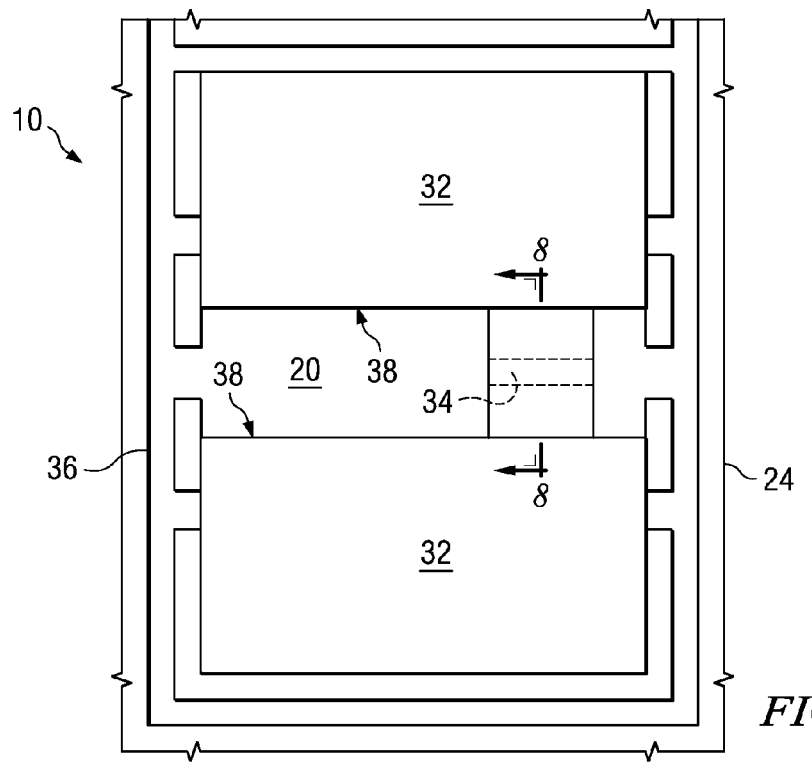
FIG. 7 is a simplified top view of a portion of a package array in another example of a preferred embodiment of the invention.
Figure 8:
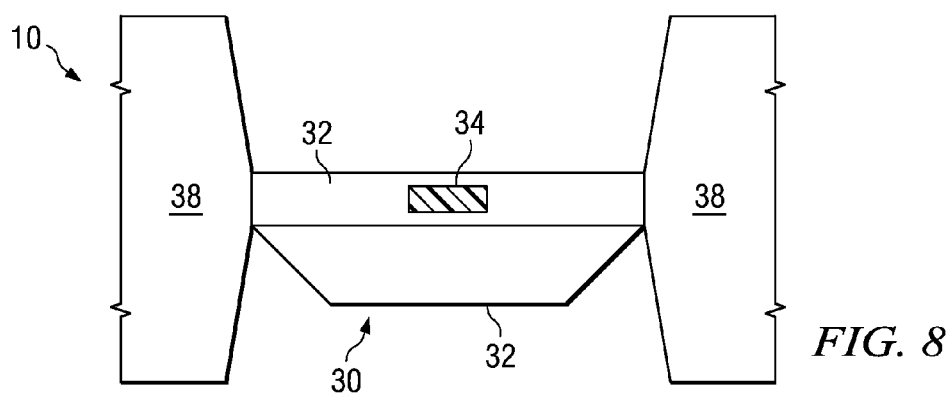
FIG. 8 is a cutaway partial side view of the package array of FIG. 7 taken along line 8.

In another example of a preferred embodiment of the invention, FIGS. 7 and 8 show a portion of a package array 36 in which the strap 22 is downset relative to the adjacent portions of the supporting structure 20 of the leadframe array 10. Upon encapsulation, the locking feature 34 is formed in a configuration in which the strap 22 spanning the gate area 30 is completely engulfed within encapsulant 32.

Figure 9:
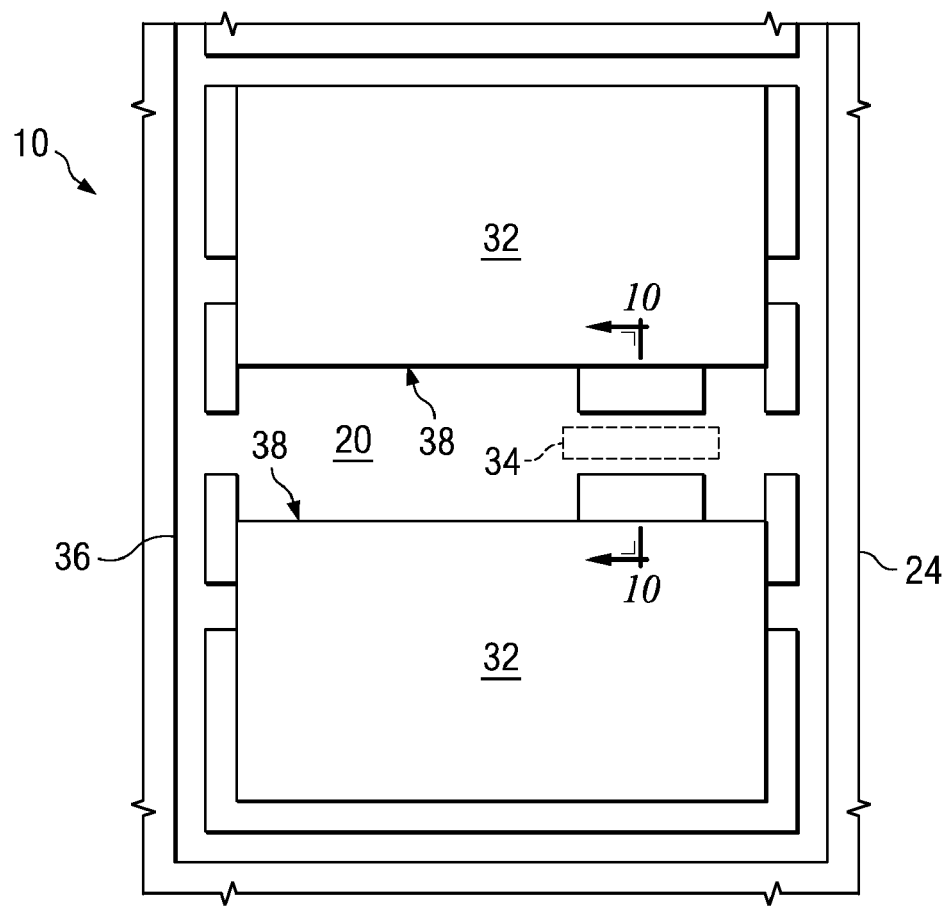
FIG. 9 is a simplified top view of a portion of a package array in another example of a preferred embodiment of the invention.
Figure 10:
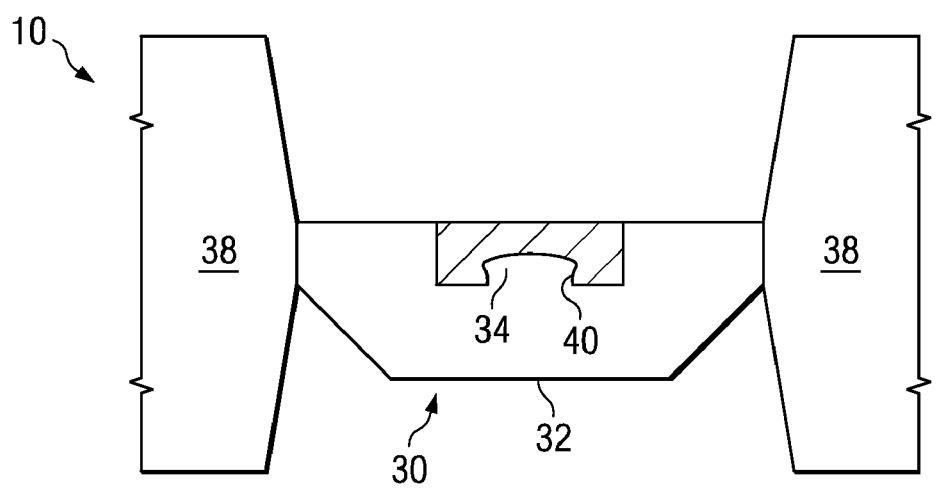
FIG. 10 is a cutaway partial side view of the package array of FIG. 9 taken along line 10.

Within the context of the description herein, it should be understood that in the example of a preferred embodiment of the invention depicted in FIGS. 9 and 10, that a locking feature 34 may alternatively be formed in the strap 22 by etching or cutting a portion of the strap 22 to form a groove for filling with encapsulant 32. In this example, it should be noted that the locking feature 34 includes a contour 40 surrounded by encapsulant configured for exerting an upward force, and resisting a downward farce, on the strap 22 when the package array 36 is extracted from the mold during manufacture. This contour 40 may be formed by etching, as shown, or be reverse beveling in the case of a cut groove locking feature.

Figure 11:
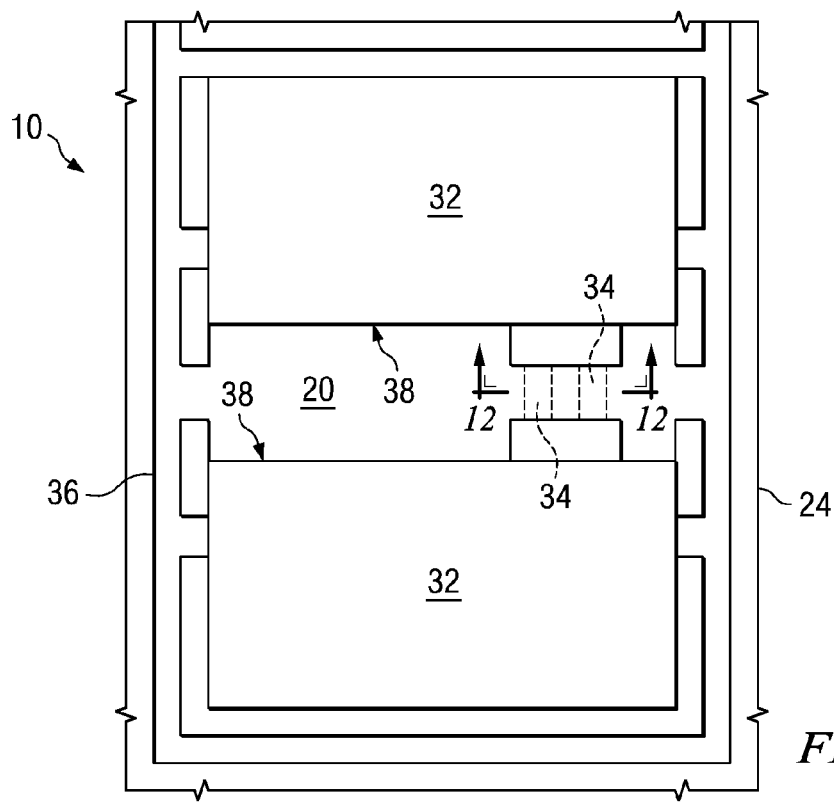
FIG. 11 is a simplified top view of a portion of a package array in another example of a preferred embodiment of the invention.
Figure 12:
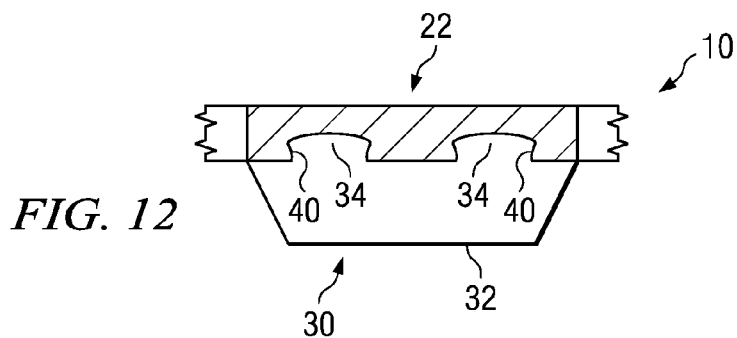
FIG. 12 is a cutaway partial side view of the package array of FIG. 11 taken along line 12.

In an effort to drive home the point that the invention may be implemented in various configurations providing the locking feature 34, another example of a preferred embodiment is shown in FIGS. 11 and 12. In this implementation, dual locking features 34 are shown in the form of parallel grooves oriented transverse to the direction of the strap 22. As in the above examples, the essentials of the locking feature 34 are provided by encapsulating portions of the strap 22 configured for exerting an upward force, and conversely resisting a downward force, on the strap 22 when the package array 36 is extracted from the mold during manufacture.

Figure 13:
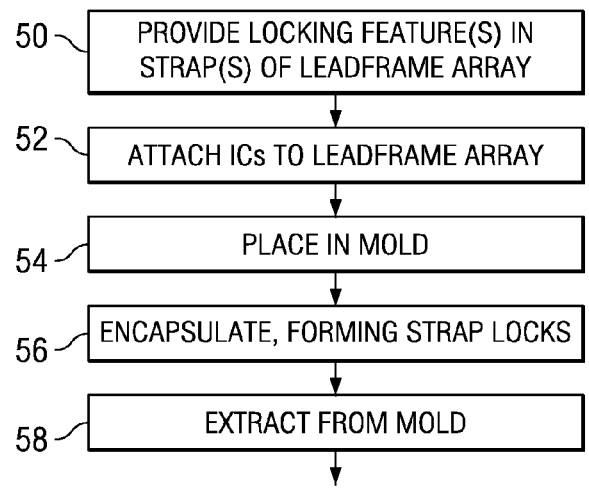
FIG. 13 is a process flow diagram of a preferred embodiment of a method of the invention.

An alternative illustration of the practice of the invention is shown in the process flow diagram of FIG. 13. One or more locking features is incorporated into one or more of the straps of a leadframe array, shown at box 50. Leadframe-IC assemblies are assembled as known in the arts by attaching ICs to the appropriate positions on the leadframe array, step 52. The leadframe array containing leadframe-IC assemblies is placed in a mold 54. Upon encapsulation, strap locks are formed by the encapsulant engulfing and curing over the locking feature(s) of the strap(s) 56. Upon extraction from the mold 58, the resulting package array may be further processed as known in the art, e.g., singulated, cleaned, marked, and incorporated into electronic apparatus.

The methods and systems of the invention provide one or more advantages including but not limited to improved strength of molded package arrays and improved package manufacturing methods. While the invention has been described with reference to certain illustrative embodiments, those described herein are not intended to be construed in a limiting sense. For example, variations or combinations of steps or materials in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

I claim:

1. An IC leadframe array comprising:
   a plurality of package regions adapted for receiving ICs and for ultimately residing within IC packages;
   a supporting structure adapted for supporting the package regions during handling and transfer molding, wherein the supporting structure further comprises a plurality of straps connecting the package regions, the straps configured for overlying the gates of a transfer mold, and wherein the straps further comprise at least one locking feature adapted for the formation of a strap lock upon transfer mold encapsulation;
   the strap having a bottom surface and side surfaces perpendicular to the bottom surface, the bottom surface and the side surfaces designed to contact the transfer mold during the transfer molding; and
   the locking feature in the straps having an additional surface portion disposed away from the bottom surface of the strap and not perpendicular to the bottom surface and on which the transfer mold comes to contact during the transfer molding.

2. The IC leadframe array according to claim 1 wherein the locking feature further comprises a groove in the strap.

3. The IC leadframe array according to claim 1 wherein the locking feature further comprises a V-groove in the strap.

4. The IC leadframe array according to claim 1 wherein the locking feature further comprises a transverse groove in the strap.

5. The IC leadframe array according to claim 1 wherein the locking feature further comprises at least one rabbeted strap edge.

6. The IC leadframe array according to claim 1 wherein the locking feature further comprises at least one beveled strap edge.

7. The IC leadframe array according to claim 1 wherein the locking feature further comprises a downset strap.

8. An IC package array comprising:
a leadframe array, the leadframe array further comprising:
a plurality of package regions adapted for receiving ICs;
a supporting structure supporting the package regions; wherein the supporting structure comprises a plurality of straps between package regions;
a plurality of ICs mounted on package regions of the leadframe array;
a transfer molded block of encapsulant encapsulating the leadframe array and mounted ICs; and
one or more strap lock formed from a portion of the strap adapted for encapsulation and filled with cured encapsulant;
the strap having a bottom surface and side surfaces perpendicular to the bottom surface, the bottom surface and the side surfaces designed to contact the transfer mold during the transfer molding; and
the locking feature of the straps having an additional surface portion disposed away from the bottom surface of the strap and not perpendicular to the bottom surface and on which the transfer mold comes to contact during the transfer molding.

9. The IC package array according to claim 8 wherein the strap lock further comprises an encapsulated groove in the strap.

10. The IC package array according to claim 8 wherein the strap lock further comprises an encapsulated V-groove in the strap.

11. The IC package array according to claim 8 wherein the strap lock further comprises a transverse groove in the strap.

12. The IC package array according to claim 8 wherein the strap lock further comprises at least one encapsulated rabbet in a strap edge.

13. The IC package array according to claim 8 wherein the strap lock further comprises at least one encapsulated bevel in a strap edge.

14. The IC package array according to claim 8 wherein the strap lock further comprises an encapsulated downset in the strap.

* * * * *